(12) United States Patent
Rossi

(10) Patent No.: US 6,774,459 B2
(45) Date of Patent: Aug. 10, 2004

(54) CAPACITOR LAYOUT TECHNIQUE FOR REDUCTION OF FIXED PATTERN NOISE IN A CMOS SENSOR

(75) Inventor: Giuseppe Rossi, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 10/216,804

(22) Filed: Aug. 13, 2002

(65) Prior Publication Data
US 2004/0032007 A1 Feb. 19, 2004

(51) Int. Cl.[7] .............................................. H01L 29/00
(52) U.S. Cl. ...................... 257/535; 257/528; 257/532; 438/329; 438/957
(58) Field of Search ................................ 257/528, 532, 257/535; 438/329, 957

(56) References Cited

U.S. PATENT DOCUMENTS 5,548,474 A * 8/1996 Chen et al. ................. 361/313
6,198,153 B1 * 3/2001 Liu et al. .................... 257/532

* cited by examiner

Primary Examiner—Nathan J. Flynn
Assistant Examiner—Scott R Wilson
(74) Attorney, Agent, or Firm—Dickstein Shapiro Morin & Oshinsky LLP

(57) ABSTRACT

A new capacitor architecture includes a front plate of the capacitor formed form a first polysilicon layer. The front plate is surround by first and second dielectric layers. The back plate of the capacitor is formed from one layer of a first two-layer conductive structure which surrounds the first and second dielectric layer. The two layer structure is an equal potential structure and includes a conductive coupling between the two layers. In one embodiment, the back plate of the capacitor is formed from a metal layer. A third and fourth dielectric layers surround the first two-layer conductive structure. A second two-layer equal potential conductive structure surrounds the third and fourth dielectric layers. In one embodiment, the second two-layer equal potential conductive structure comprise an interconnect between a metal layer and the substrate.

70 Claims, 6 Drawing Sheets

US 6,774,459 B2

CAPACITOR LAYOUT TECHNIQUE FOR REDUCTION OF FIXED PATTERN NOISE IN A CMOS SENSOR

FIELD OF INVENTION

The present invention relates to a CMOS active pixel sensor system. More specifically, the present invention is directed to a capacitor architecture useful for minimizing fixed pattern noise in a sample-and-hold stage of a CMOS active pixel sensor system.

BACKGROUND OF THE INVENTION

FIG. 1 is an illustration of a front-end portion of a color CMOS active pixel sensor (APS) imaging system 100. The system 100 includes a N×M pixel array 110 comprised of pixels R, G, B which are sensitive to red, green, and blue colored light, respectively. The pixels R, G, B are typically arranged in a Bayer pattern, in which alternating rows are comprised of green/red and green/blue pixels in adjacent columns.

Any image focused upon the pixel array 110 causes the pixels R, G, B to convert the incident light into electrical energy. As will be described in greater detail below, this conversion typically results in a pixel outputting two electrical signals, namely the reset signal and a photo signal. Typically, CMOS APS imaging systems 100 operate by selecting and coupling a row of pixels, via signal lines 206 to a sample-and-hold circuit 120. The sample-and-hold circuit 120 includes M subcircuits 121 which are coupled to a bus 122. Each of the subcircuits 121 samples and holds the reset and photo signals from one of the pixels of the selected row. The M subcircuits 121 are sequentially selected to couple (via bus 122, comprising reset signal line 122r and photo signal line 122p) the sampled reset and photo signals to a driver 130. The driver 130 performs additional processing, which may include, for example, signal amplification or conditioning. The output of the driver 130 is then provided to an analog-to-digital converter 140, which converts the sampled signals into a digital signal. The digital signal can then be provided to the remainder (not illustrated) of the APS imaging system 100 for further processing, manipulation, and storage. The above process is then repeated with the next pixel in the selected row by selecting the next sequential subcircuit 121 until the entire selected row has been processed. The above described processing is then performed on another row until every row in the array 110 has been processed. In alternative implementations the rest and photo signals are combined (e.g., subtracted) at the output of the sample-and-hold circuit 121 or in driver 130 so that the analog-to-digital converter receives a combined signal from each pixel.

FIG. 2 is a more detailed illustration of a pixel (R, G, or B). The pixel includes an element, such as photodiode 201, for converting optical energy to electrical energy. The photodiode 201 is sensitive to green light if the pixel is a green (G) pixel, red light if the pixel is a red (R) pixel, or blue fight if the pixel is a blue (B) pixel. The pixels are made color sensitive by red, green, or blue filters as well known in the art. The output of the photodiode 201 is coupled to the gate of source-follower transistor 203 via the source/drain terminals of a transfer transistor 202 and node-A. A power source having a potential level of Vdd is coupled to column output line 206 via the source/drain terminals of the source follower transistor 203 and a row select transistor 204, which has its gate coupled via signal line 210 to a ROW signal. The ROW signal is also coupled to other pixels (R, G, or B) in the same row. A power source having a reset voltage potential level of Vrst is coupled to the gate of the source-follower transistor 203 via the source/drain terminals of transistor 205 and node-A. The gate of transistor 205 is coupled to reset signal line 208 to the RST signal. The gate of the transfer transistor 202 is coupled via signal lines 209 and 207 to a transfer (TX) signal.

The pixel (R, G, or B) is operated in a manner to include a two phase process, wherein a reset signal is output during a first phase and a photo signal is output during a second phase. At the beginning of the first phase, the ROW signal of the pixel is asserted, thereby switching on transistor 204. The TX signal is not asserted, thus transistor 202 is switched off, and the signal from the photodiode 201 is isolated from the gate of the source follower transistor 203. The RST signal is asserted, thereby switching on transistor 205 and coupling the Vrst power source to the gate of the source follower transistor 203 via node-A. This causes a current to flow from the Vdd power source to the output line 206. After a predetermined amount of time, the RST signal is then de-asserted, thereby switching off the source follower transistor 203 and terminating the first phase.

The second phase begins with the assertion of the TX signal, which switches on the transfer transistor 202, thereby permitting the signal produced by the photodiode 201 to be applied to the gate of the source-follower transistor 203. This causes a current to flow from the Vdd power source to the output line 206. After a predetermined amount of time, the TX signal is de-asserted, thereby switching off the transfer transistor 202 and terminating the second phase. The ROW signal is then de-asserted, thereby isolating the pixel from the output line 206.

FIG. 3 is an illustration of the sample-and-hold subcircuit 121. The subcircuit 121 includes a portion for sampling and holding the reset signal 301r and a portion for sampling and holding the photo signal 301p. Each of these sections 301r, 301p are coupled in parallel to signal line 301, which is also coupled to the column output line 206 for a column of pixels (FIG. 2) at node-B. Each section 301r, 301p includes an isolation switch 351, 352 coupled in series to a sampling capacitor 302, 303, respectively. Each sampling capacitor 302, 303 is also coupled in series to its own column select switch 355. Additionally, the sample-and-hold subcircuit 121 includes a crowbar switch 353 which may be used to couple the front plates of the sampling capacitors 302, 303. Each portion 301r, 301p further includes a clamping switch 354, located between the sampling capacitor 302, 303 and the column select switch 355, which may be used to couple the back plates of the sampling capacitors 354 to a clamp voltage Vcl. The sample-and-hold subcircuit also includes a switchable current source 356 for the source follower transistor 203 (FIG. 2) of the pixel. The output of the sample-and-hold subcircuit 121 includes a photo signal at node-C and a reset signal at node-D. Nodes-C/D are coupled to respective lines 122p, 122r of a bus 122 (FIG. 1).

The sample-and-hold subcircuit 121 operates as follows. The sample-and-hold subcircuit 121 is initialized by switching on the current source 356 (for line 301), thereby coupling the output line 206 (FIG. 2) of the pixel (R, G, or B) to ground via line 301. Switches 351, 352, and 353 are open. Both switches 354 are closed, and a clamping voltage Vcl is applied to the back plates of capacitors 302, 303. The clamping voltage Vcl is a stable voltage source over time (i.e., it has a very high rejection of variation of supply voltage), and is used to shift the output of the subcircuit 121 (at nodes-C/D) in order to match the output of the subcircuit 121 with the input of subsequent circuitry (e.g., driver 130). Both switches 354 are then opened.

During the first phase of the pixel operation (in pixel R, G, or B of FIG. 2), column select switches 355 are opened. Switch 352 is closed, to couple the reset portion 301r to the pixel output, which charges sampling capacitor 303. Switch 352 is opened when the first phase of pixel output is completed. As the second phase of pixel output begins, switch 351 is closed to permit the second phase pixel output to charge sampling capacitor 302. Switch 351 is opened when the second phase of pixel output is completed. These operations are performed by each of the subcircuits 121 at the same time, since there is one subcircuit 121 provided for each pixel (R, G, or B) in a row. The output of each pixel may be sequentially output by the sample-and-hold circuit 120 by sequentially closing both column select switches 355 in each subcircuit 121, one subcircuit 121 at a time. When both switches 355 are closed in a particular subcircuit 121, it couples the sampling capacitors 302, 303 of that circuit 121 to lines 122p, 122r (FIG. 1) of a bus 122, which couples the sample-and-hold circuit 120 to the driver 130.

The reset and photo signal comprise a differential signal which can be further manipulated by the driver 130 before being digitized by the analog-to-digital converter 140. Alternatively, the photo signal can be subtracted from the reset signal before being digitized. A control circuit 150, which is coupled to the pixel array 110, sample-and-hold circuit 120, driver 130, and analog-to-digital converter 140, may be used to coordinate the operation of these circuits.

One issue associated with APS CMOS imaging systems is that of fixed pattern noise, which is a type of distortion in the image captured by the imaging system. One source of fixed pattern noise is due to imperfections in the sample-and-hold subcircuits 121, including those caused by a failure in a subcircuit to accurately sample the reset and photo signals.

This failure may be due to parasitic capacitance in subcircuit 121. For example, when the subcircuit 121 of FIG. 3 is implemented using conventional fabrication techniques, the result is the subcircuit 121' illustrated in FIG. 4. The subcircuit 121' is similar to the subcircuit 121 (FIG. 3), but includes three types of parasitic capacitance. These include a primary cross capacitance 401 which couple the front plates of both sampling capacitors 301, 302, as well as secondary cross capacitances 402, 403, which respectfully couple the front plate of one sampling capacitor 301, 302 to the back plate of the other sampling capacitor 302, 301. The amount of parasitic capacitance may be significant, i.e., ranging approximately five to ten percent of the capacitance of the sampling capacitors 301, 302. For example, when the sample capacitors are 1 pico-farad capacitors, the primary cross capacitance 401 can be approximately 120 femto-farad, while secondary cross capacitances 402, 403 may be approximately 40 femto-farad. The presence of these parasitic capacitances, especially the primary cross capacitance 401, is responsible for a large portion of the fixed pattern noise. Accordingly, there is a need and desire for efficient method for producing a sample-and-hold subcircuit 121 which minimizes the effect of parasitic capacitance.

SUMMARY OF THE INVENTION

The present invention is directed to a new capacitor structure for use as a sampling capacitor in a sample-and-hold subcircuit of an APS CMOS imaging system. The parasitic capacitance found in conventional sample-and-hold subcircuits are primarily a side effect of the traditional capacitor layout. In accordance with the principles of the present invention, a capacitor is restructured to shield the most sensitive electrode node between a set of equal potential layers to form a capacitor back plate. This first set of equal potential layers is itself surrounded by a second set of equal potential layers to act as a guard plate connected to ground. This arrangement shields both capacitors plates from stray coupling with outside parasitic elements and can reduce fixed pattern noise by a factor of eight.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

Figure 5:
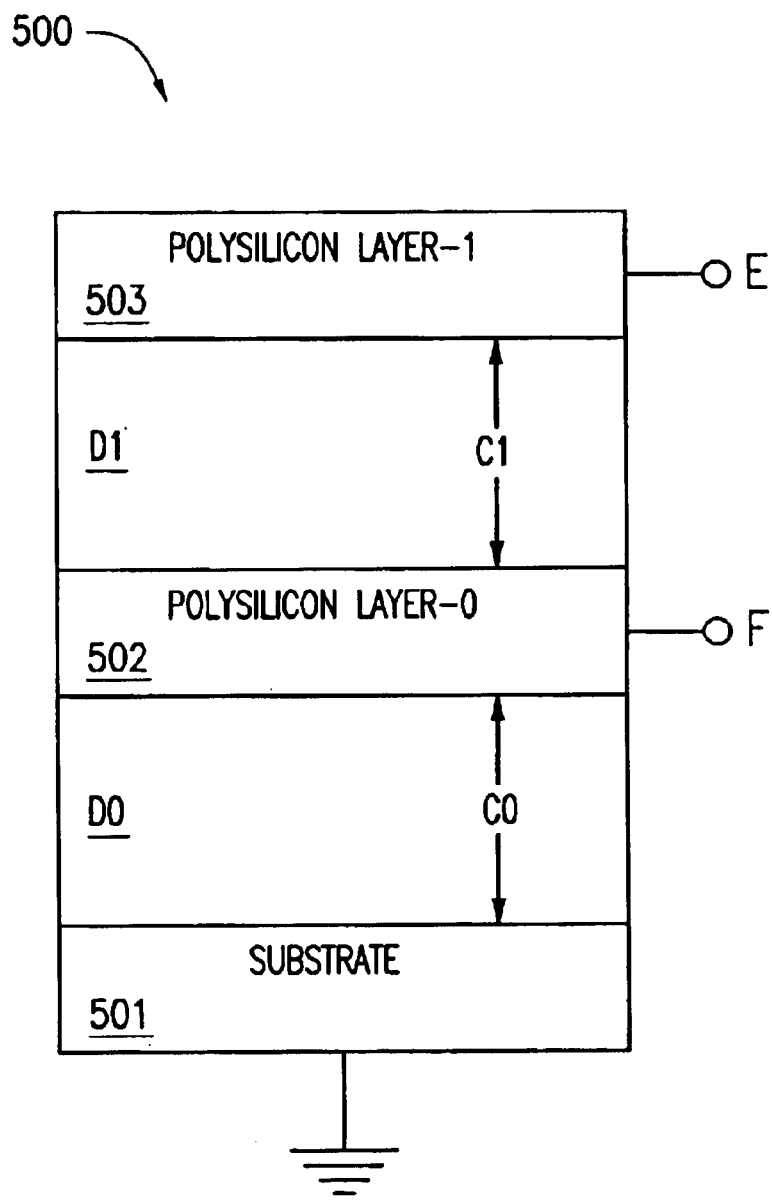
FIG. 5 is a diagram of a conventional capacitor.

One important source of parasitic capacitance arises from the way capacitors, such as sampling capacitors 301, 302 are conventionally fabricated. Now referring to the drawings, where like reference numerals designate like elements, there is shown in FIG. 5 an illustration of an integrated circuit capacitor 500 fabricated in the conventional manner. The capacitor 500 includes a substrate layer 501, which is coupled to ground. Dielectric layer D0, polysilicon layer-0 502, dielectric layer D1, and polysilicon layer-1 503 are respectively layered above the substrate 501. The capacitor 500 is formed between node-E and node-F. The two polysilicon layers 502, 503, which sandwich dielectric layer D1, serve as the two plates of the capacitor 500, which has a capacitance of C1.

This traditional method of producing a capacitor 500 provides undesirable electric field interactions at both polysilicon layers 502, 503. More specifically, electric field lines may radiate through the polysilicon layers 502, 503 and couple the respective polysilicon layer 502, 503 with another conductive layer to form parasitic capacitance between the capacitor 500 and the other conductive layer.

For example, polysilicon layer-0 502 may couple with the substrate 501 to form parasitic capacitance C0. Similarly, in many instances at least one additional metal layer, such as routing lines (not illustrated), may be formed above polysilicon layer-1 503. This may result in a parasitic capacitance coupling between polysilicon layer-1 503 and the routing lines.

Figure 6:
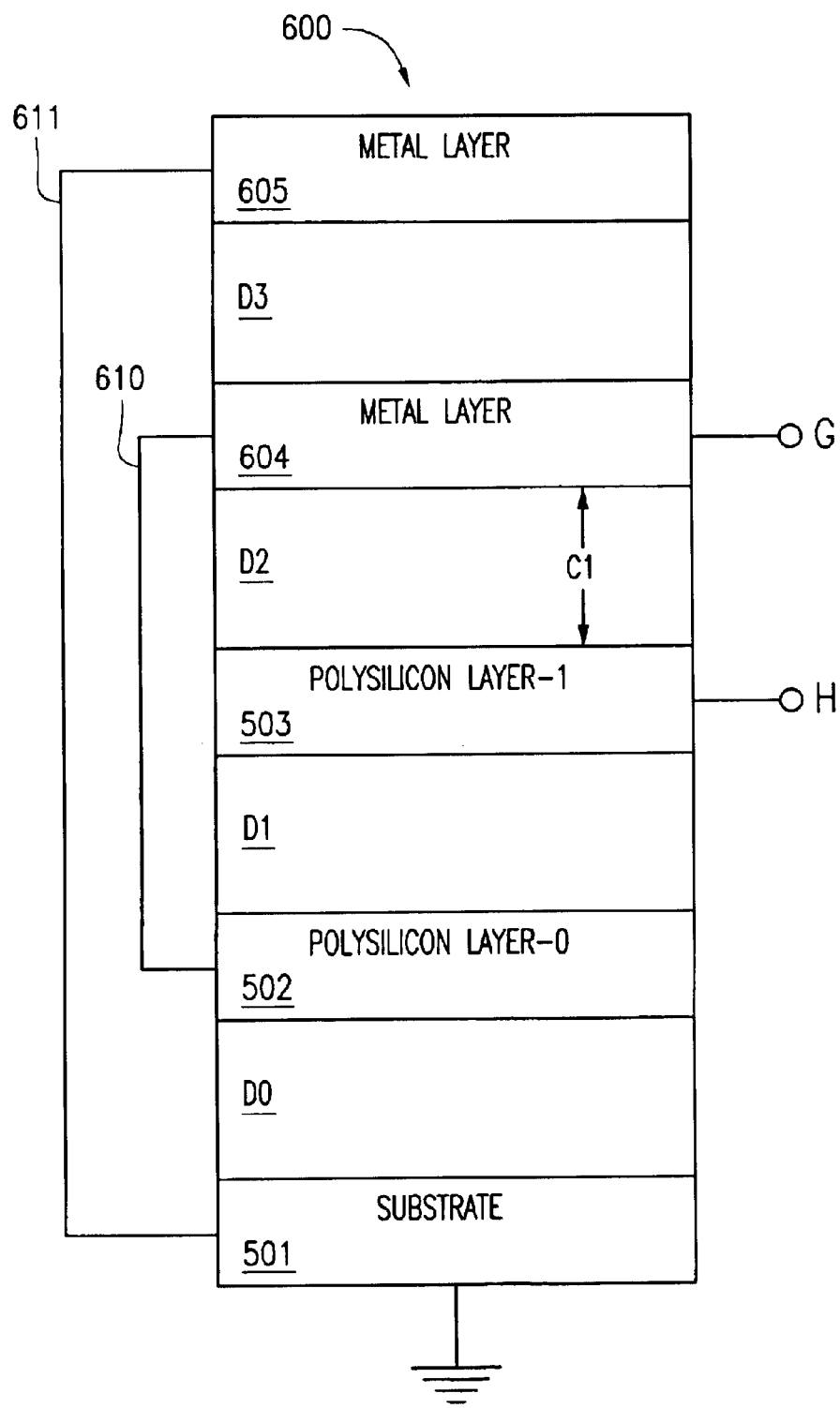
FIG. 6 is a diagram of a capacitor in accordance with the principles of the present invention.

FIG. 6 is a diagram of the new capacitor 600 in accordance with the invention. The capacitor 600 may be formed by sequentially depositing over a substrate 501 a first dielectric layer D0, a first polysilicon layer 502, a second dielectric layer D1, a second polysilicon layer 503, a third dielectric layer D2, a first metal layer 604, a third dielectric layer D3, and a second metal layer 605 to form a stack as shown in FIG. 6. Interlayer interconnects 610, 611 can be formed in the conventional manner to conductively couple the first metal layer 604 with the first polysilicon layer 502, and to conductively couple the second metal layer 605 with the substrate 501. The new capacitor 600 has a capacitance C1 formed between node-G and node-H, i.e., from the first metal layer 604 to the second polysilicon layer 503. Within the context of the sample-and-hold subcircuit 121, the capacitor 600 is to be oriented so that node-H is coupled to the portion of the subcircuit 121 including the front plate of the sampling capacitors 302, 303, while node-G is coupled to the portion of the subcircuit 121 including the back plate of the sampling capacitors 302, 303.

As illustrated by FIG. 6, the architecture of the capacitor 600 shields the front plate portion, i.e., node-H and second polysilicon layer 503, of the capacitor 600 by placing it between two equal potential layers, i.e., first metal layer 604 and first polysilicon layer 502. The first metal layer 604 and the first polysilicon layer are at equal potential because they are conductively coupled by line 610. Similarly, a second set of equal potential surfaces, i.e., the substrate 501 and the second metal layer 605, both of which are tied to ground potential at the substrate 501, surrounds and shields the first set of equal potential surfaces.

The use of the two sets of equal potential surfaces causes any electric field lines which radiate from the front plate (i.e., the second polysilicon layer 503) to couple to either first metal layer 604, or the first polysilicon layer 502, both of which form the back plate of the new capacitor 600. In this manner, what would ordinarily be parasitic capacitance between the front plate of the capacitor 600 and another circuit has been redirected to become a part of the capacitance C1 of the capacitor 600. Although parasitic capacitance between the back plate of the capacitor 600 and other circuit is less important in subcircuit 121 because the back plate (first metal layer 605 and first polysilicon layer 502) is typically driven to the clamp voltage in subcircuit 121, the back plate of the capacitor 600 is also shield by the second set of equal potential surfaces (substrate 501 and second metal layer 605).

The present invention therefore provides for an shielded capacitor formed with additional conductive layers. Although the illustrated embodiment used additional metal layers, other types of conductive layers, for example, polysilicon layers, would also be suitable. The two additional conductive layers 604, 605, are separated from each other and from polysilicon layer-1 503 by dielectric layers D2, D3. Polysilicon layer-0 is coupled to metal layer 604 to form a first equal potential shield around polysilicon layer-1 503, which is also the front plate of the new capacitor 600. The back plate of the new capacitor 600 is metal layer 604, which, as mentioned above, is coupled to polysilicon layer-0. A second equal potential shield is formed by coupling metal layer 605 with substrate 501, which is coupled to ground. This arrangement shields both capacitors plates from stray coupling with outside parasitic elements. When capacitors having this architecture are used in imaging systems, fixed pattern noise can be greatly reduced. For example, in one embodiment, use of this type of capacitor architecture reduced fixed pattern noise by a factor of eight.

Figure 1:
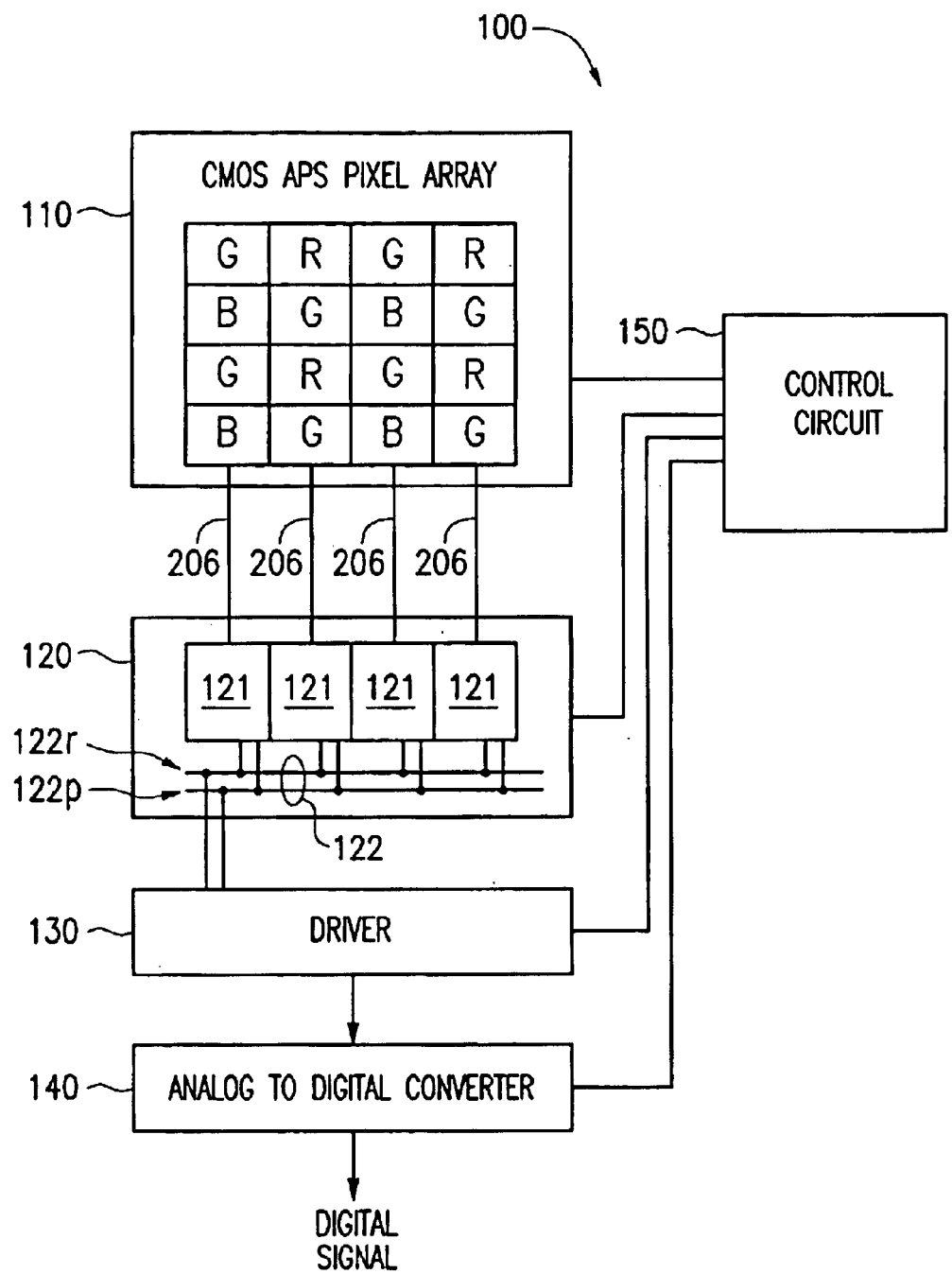
FIG. 1 is a block diagram of a front-end portion of a CMOS APS system.
Figure 2:
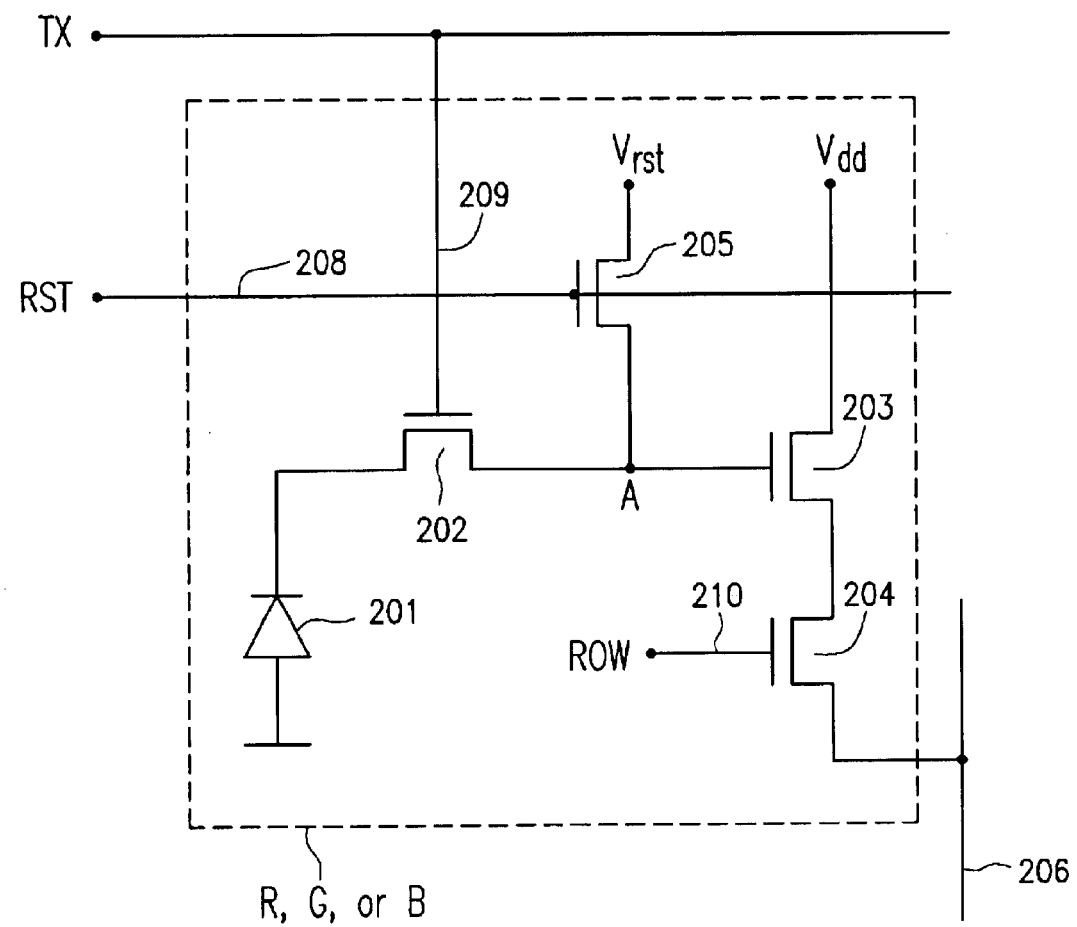
FIG. 2 is a more detailed diagram of a pixel.
Figure 3:
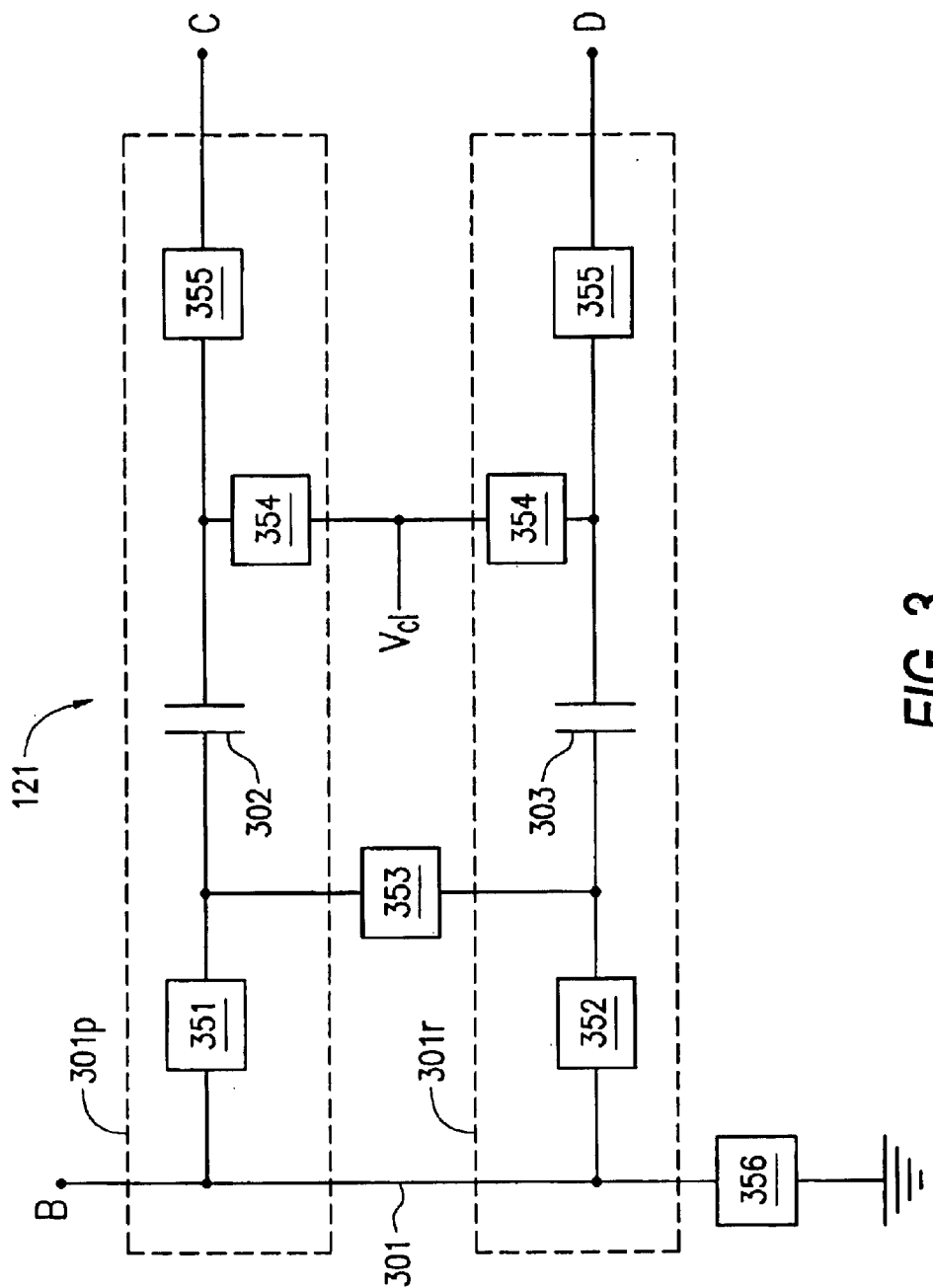
FIG. 3 is a more detailed diagram of one of the sample-and-hold subcircuit 121 found in the sample-and-hold circuit 120.
Figure 4:
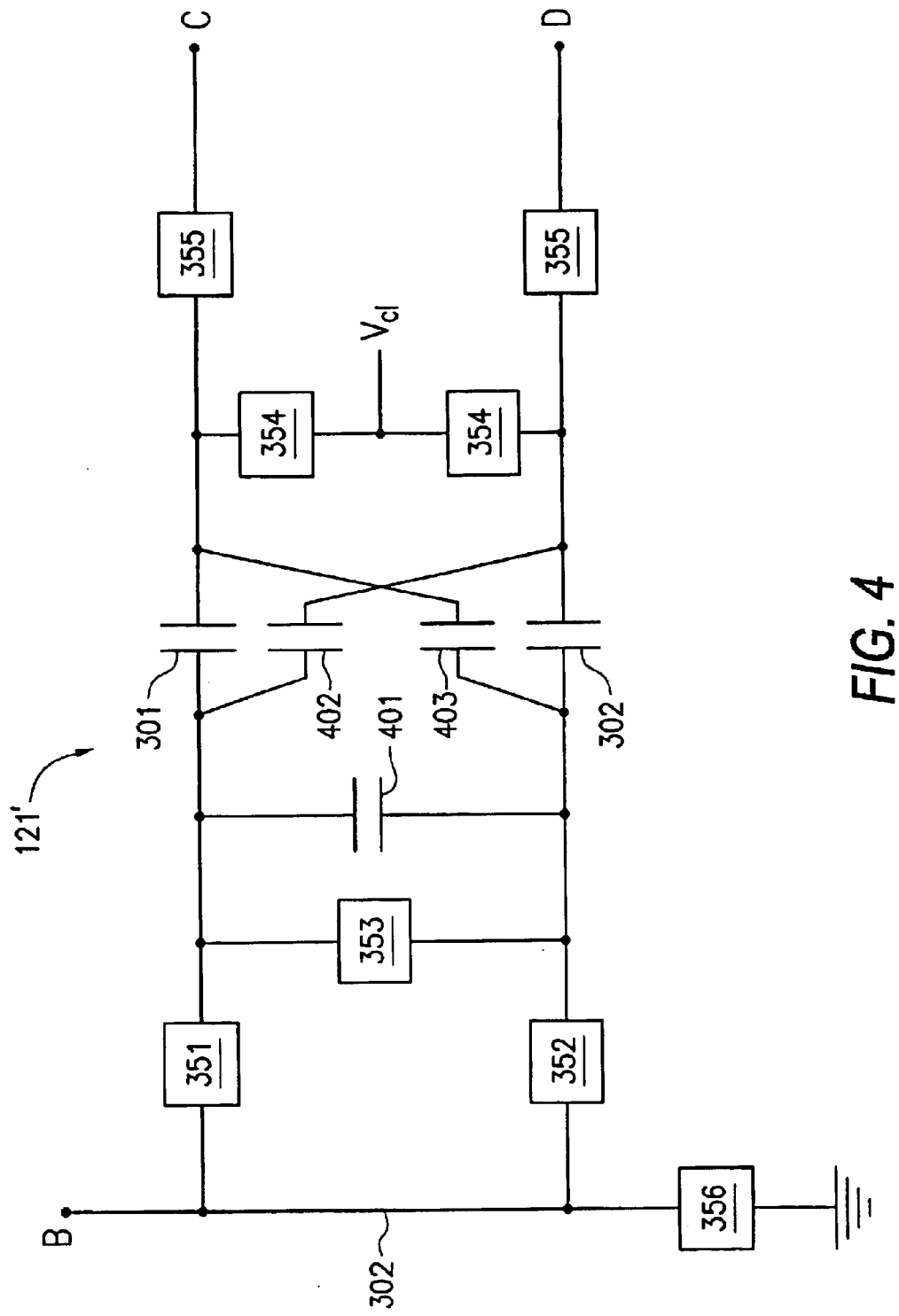
FIG. 4 is a block diagram illustrating the effect of parasitic capacitance upon the circuit of FIG. 3.

The new capacitor 600 of the present invention is suitable for use in any environment in which the front plate of the capacitor must be isolated from parasitic capacitance. Although the back plate of the new capacitor 600 is also somewhat isolated by the second equal potential layer comprising the substrate 501 and metal layer 605, the capacitor of the present invention is preferably used in an environment such as sampling capacitors 302, 303 in the sample-and-hold subcircuit 121 (FIG. 3), where the back plate voltage is also controlled by driving it with an external power source.

While the invention has been described in detail in connection with the exemplary embodiment, it should be understood that the invention is not limited to the above disclosed embodiment. Rather, the invention can be modified to incorporate any number of variations, alternations, substitutions, or equivalent arrangements not heretofore described, but which are commensurate with the spirit and scope of the invention. Accordingly, the invention is not limited by the foregoing description or drawings, but is only limited by the scope of the appended claims.

What is claimed as new and desired to be protected by Letters Patent of the United States is:

1. A method of forming a capacitor, said method comprising:

forming a first conductive layer as a front plate of the capacitor;

forming a first dielectric layer over and adjacent to said front plate;

forming a second dielectric layer below and adjacent to said front plate;

forming a first conductive structure surrounding said first and second dielectric layers;

forming a third dielectric layer above and adjacent to the first conductive structure;

forming a fourth dielectric layer below and adjacent the first conductive structure; and forming a second conductive structure surrounding said third and fourth dielectric layers.

2. The method of claim 1, wherein said step of forming said first conductive structure comprises, forming a first layer adjacent to a first one of said first and second dielectric layers;

forming a second layer adjacent to a second one, different from said first one, of said first and second dielectric layers; and forming a conductive interconnect coupling said first and second layers;

wherein,
said first and second layers are conductive;
said first and second layers are equal potential; and
one of said first and second layers forms a back plate of said capacitor.

3. The method of claim 2, wherein said first one of said first and second dielectric layers is an upper one of said first and second dielectric layers, and said step of forming a first layer further comprises, forming a metal layer above said first dielectric layer.

4. The method of claim 3, wherein said metal layer is formed as the back plate to said capacitor.

5. The method of claim 2, wherein said first one of said first and second dielectric layers is an upper one of said first and second dielectric layers, and said step of forming a first layer further comprises, forming a polysilicon layer above said first dielectric layer.

6. The method of claim 5, wherein said polysilicon layer is formed as the back plate to said capacitor.

7. The method of claim 2, wherein said step of forming a second layer further comprises, forming a polysilicon layer below said second dielectric layer.

8. The method of claim 2, wherein said step of forming a second layer further comprises, forming a metal layer below said second dielectric layer.

9. The method of claim 8, wherein said step of forming a fourth layer further comprises, forming a substrate below said fourth dielectric layer.

10. The method of claim 9, further comprising, grounding said substrate.

11. The method of claim 1, wherein said step of forming said second conductive structure comprises,
forming a third layer adjacent to a first one of said third and fourth dielectric layers;
forming a fourth layer adjacent to a second one, different form said first one, of said third and fourth dielectric layers; and
forming a conductive interconnect coupling said third and fourth layers;
wherein,
the third and fourth layers are conductive, and
said third and fourth layers are equal potential.

12. The method of claim 11, wherein said step of forming a third layer comprises, forming a second metal layer above an upper one of said third and fourth dielectric layers.

13. The method of claim 1, wherein said step of forming a first conductive layer forms a polysilicon layer.

14. The method of claim 1, wherein said step of forming a first conductive layer forms a metal layer.

15. A capacitor, comprising:
a front plate comprising a first conductive layer;
a first dielectric layer above and adjacent to said front plate;
a second dielectric layer below and adjacent to said front plate;
a first conductive structure surrounding said first and second dielectric layers, said conductive structure including a back plate of said capacitor;
a third dielectric layer above and adjacent to said first conductive structure;
a fourth dielectric layer below and adjacent to said first conductive structure; and
a second conductive structure surrounding said third and fourth layers.

16. The capacitor of claim 15, wherein said first conductive structure further comprises:
a first layer adjacent to a first one of said first and second dielectric layers;
a second layer adjacent to second one of said first and second dielectric layers; and
a conductive interconnect coupling said first and second layers;
wherein,
said first and second layers are conductive;
said first and second layers are equal potential; and
one of said first and second layers forms the back place of the capacitor.

17. The capacitor of claim 16, wherein said first one of said first and second dielectric layers is an upper one of said first and second dielectric layers, and said first layer is comprised of a metal layer.

18. The capacitor of claim 17, where said first layer is the back plate of said capacitor.

19. The capacitor of claim 16, wherein said first one of said first and second dielectric layers is an upper one of said first and second dielectric layers, and said first layer is comprised of a polysilicon layer.

20. The capacitor of claim 19, where said first layer is the back plate of said capacitor.

21. The capacitor of claim 16, wherein said second layer comprises polysilicon located below and adjacent to said second dielectric layer.

22. The capacitor of claim 16, wherein said second layer comprises metal located below and adjacent to said second dielectric layer.

23. The capacitor of claim 15, wherein said second conductive structure further comprises:
a third layer adjacent to a first one of said third and fourth dielectric layers;
a fourth layer adjacent to a second one, different from said first one, of said third and fourth dielectric layers; and
a conductive interconnect coupling said third and fourth layers;
wherein,
said third and fourth layers are conductive; and
said third and fourth layers are equal potential.

24. The capacitor of claim 23, further comprising:
a second metal layer disposed above an upper one of said third and fourth dielectric layers.

25. The capacitor of claim 23, wherein said second fourth layer is a substrate.

26. The capacitor of claim 25, wherein said substrate is grounded.

27. The capacitor of claim 15, wherein said first conductive layer is comprised of polysilicon.

28. The capacitor of claim 15, wherein said first conductive layer is comprised of a metal.

29. A circuit for sampling signals produced by a pixel, comprising:
an input line for receiving signals produced by said pixel;
a sample capacitor; and
a switch for controllably coupling said sample capacitor to said input line;
wherein said sample capacitor is fabricated as a semiconductor device and further comprises,
a front plate, wherein said front plate is a first conductive layer;
a first dielectric layer above and adjacent to said front plate;
a second dielectric layer below and adjacent to said front plate;
a first conductive structure surrounding said first and second dielectric layers, said conductive structure including a back plate of said capacitor;
a third dielectric layer above and adjacent to said first conductive structure;
a fourth dielectric layer below and adjacent to said first conductive structure; and
a second conductive structure surrounding said third and fourth layers.

30. The circuit of claim 29, wherein said first conductive structure further comprises:
a first layer adjacent to a first one of said first and second dielectric layers;
a second layer adjacent to second one of said first and second dielectric layers; and
a conductive interconnect coupling said first and second layers;
wherein,
said first and second layers are conductive;
said first and second layers are equal potential; and
one of said first and second layers forms the back place of the capacitor.

31. The circuit of claim 30, wherein said first one of said first and second dielectric layers is an upper one of said first and second dielectric layers, and said first layer is comprised of a metal layer.

32. The circuit of claim 31, where said first layer is the back plate of said capacitor.

33. The circuit of claim 30, wherein said first one of said first and second dielectric layers is an upper one of said first and second dielectric layers, and said first layer is comprised of a polysilicon layer.

34. The circuit of claim 33, where said first layer is the back plate of said capacitor.

35. The circuit of claim 30, wherein said second layer comprises polysilicon located below and adjacent to said second dielectric layer.

36. The circuit of claim 30, wherein said second layer comprises metal located below and adjacent to said second dielectric layer.

37. The circuit of claim 29, wherein said second conductive structure further comprises:
- a third layer adjacent to a first one of said third and fourth dielectric layers;
- a fourth layer adjacent to a second one, different from said first one, of said third and fourth dielectric layers; and
- a conductive interconnect coupling said third and fourth layers;
- wherein,
   - said third and fourth layers are conductive; and
   - said third and fourth layers are equal potential.

38. The circuit of claim 37, wherein said first one of said third and fourth dielectric layers is an upper one of said first and second dielectric layers, and said step of forming a fourth layer comprises:
- forming a metal layer above said first dielectric layer.

39. The circuit of claim 37, wherein said first one of said third and fourth dielectric layers is an upper one of said first and second dielectric layers, and said step of forming a fourth layer comprises:
- forming a polysilicon layer above said first dielectric layer.

40. The circuit of claim 37, wherein said second layer is a substrate.

41. The circuit of claim 40, wherein said substrate is grounded.

42. The circuit of claim 29, wherein said first conductive layer is comprised of polysilicon.

43. The circuit of claim 29, wherein said first conductive layer is comprised of a metal.

44. A method of forming a capacitor in a semiconductor device, said method comprising:
- forming a first plate of said capacitor with a conductive layer;
- forming a first conductive structure surrounding and thereby shielding said first plate, said step of forming comprising forming a second plate of said capacitor;
- forming a second conductive structure surrounding and thereby shielding said first plate and said second plate.

45. The method of claim 44, wherein said conductive layer is formed as a polysilicon layer.

46. The method of claim 44, wherein said conductive layer is formed as a metal layer.

47. The method of claim 44, wherein said step of forming a first conductive structure further comprises,
- forming a second conductive layer;
- forming a conductive interconnect to conductively couple said second plate and said second conductive layer.

48. The method of claim 47, wherein said second conductive layer is formed as a polysilicon layer.

49. The method of claim 47, wherein said second conductive layer is formed as a metal layer.

50. The method of claim 44, wherein said step of forming a second conductive structure further comprises,
- forming a third conductive layer;
- forming a conductive interconnect to conductively couple said third conductive layer and a substrate layer.

51. The method of claim 50, wherein said third conductive layer is formed as a polysilicon layer.

52. The method of claim 50, wherein said third conductive layer is formed as a metal layer.

53. A semiconductor capacitor, comprising:
- a first plate;
- a first conductive structure surrounding and thereby shielding said first plate, said first conductive structure further comprising a second plate of said capacitor; and
- a second conductive structure surrounding and thereby shielding said first plate and said second plate.

54. The semiconductor capacitor of claim 53, wherein said first plate is comprised of polysilicon.

55. The semiconductor capacitor of claim 53, wherein said first plate is comprised of a metal.

56. The semiconductor capacitor of claim 53, wherein said first conductive structure further comprises,
- a second conductive layer; and
- a conductive interconnect conductively coupling said second plate and said second conductive layer.

57. The semiconductor capacitor of claim 56, wherein said second conductive layer is comprised of polysilicon.

58. The semiconductor capacitor of claim 56, wherein said second conductive layer is comprised of a metal.

59. The semiconductor capacitor of claim 53, wherein said second conductive structure further comprises,
- a third conductive layer;
- a substrate; and
- a conductive interconnect coupling said substrate and said third conductive layer.

60. The semiconductor capacitor of claim 59, wherein said third conductive layer comprises polysilicon.

61. The semiconductor capacitor of claim 59, wherein said third conductive layer comprises a metal.

62. A circuit for sampling signals produced by a pixel, comprising:
- an input line for receiving signals produced by said pixel;
- a sample capacitor; and
- a switch for controllably coupling said sample capacitor to said input line;
- wherein said sample capacitor is fabricated as a semiconductor device and further comprises,
   - a first plate;
   - a first conductive structure surrounding and thereby shielding said first plate, said first conductive structure further comprising a second plate of said capacitor;
   - a second conductive structure surrounding and thereby shielding said first plat and said second plate.

63. The circuit of claim 62, wherein said first plate is comprised of polysilicon.

64. The circuit of claim 62, wherein said first plate is comprised of a metal.

65. The circuit of claim 62, wherein said first conductive structure further comprises,
- a second conductive layer; and
- a conductive interconnect conductively coupling said second plate and said second conductive layer.

66. The circuit of claim 65, wherein said second conductive layer is comprised of polysilicon.

67. The circuit of claim 65, wherein said second conductive layer is comprised of a metal.

68. The circuit of claim 62, wherein said second conductive structure further comprises,
- a third conductive layer;
- a substrate; and
- a conductive interconnect coupling said substrate and said third conductive layer.

69. The circuit of claim 68, wherein said third conductive layer comprises polysilicon.

70. The circuit of claim 68, wherein said third conductive layer comprises a metal.

* * * * *